United States Patent
Harvey et al.

(10) Patent No.: US 9,589,949 B1
(45) Date of Patent: Mar. 7, 2017

(54) ELECTRO-STATIC DISCHARGE PROTECTION IN INTEGRATED CIRCUIT BASED AMPLIFIERS

(71) Applicant: MACOM Technology Solutions Holdings, Inc., Lowell, MA (US)

(72) Inventors: James T. Harvey, Tennyson Point (AU); Simon J. Mahon, Avalon (AU); Anna Dadello, Chippendale (AU)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 323 days.

(21) Appl. No.: 14/515,797

(22) Filed: Oct. 16, 2014

(51) Int. Cl.
*H01L 27/02* (2006.01)
*H03F 1/52* (2006.01)

(52) U.S. Cl.
CPC ...... *H01L 27/0255* (2013.01); *H01L 27/0266* (2013.01); *H03F 1/523* (2013.01); *H03F 2200/294* (2013.01)

(58) Field of Classification Search
CPC . H01L 27/0255; H01L 27/0266; H03F 1/523; H03F 2200/294

USPC .......................................................... 361/56
See application file for complete search history.

(56) References Cited

U.S. PATENT DOCUMENTS 6,075,686 A * 6/2000 Ker ..................... H01L 27/0251
361/56

* cited by examiner

*Primary Examiner* — Thienvu Tran
*Assistant Examiner* — Kevin J Comber
(74) *Attorney, Agent, or Firm* — Christopher P. Maiorana, PC

(57) ABSTRACT

An apparatus having a plurality of power pads of an integrated circuit, a plurality of transistors, and one or more diodes is disclosed. Each transistors may have a drain that forms a junction with a conductive layer of the integrated circuit. The diodes may be coupled between two of the power pads. A first portion less than all of an electro-static discharge that passes through a first of the two power pads and the conductive layer may be transferred through a first of the drains in a first of the transistors. A second portion less than all of the electro-static discharge may be transferred sequentially through (a) at least one of the diodes and (b) a second of the drains in a second of the transistors.

17 Claims, 5 Drawing Sheets

ELECTRO-STATIC DISCHARGE PROTECTION IN INTEGRATED CIRCUIT BASED AMPLIFIERS

FIELD OF THE INVENTION

The present invention relates to electro-static discharge protection generally and, more particularly, to a method and/or apparatus for implementing an electro-static discharge protection in integrated circuit based amplifiers.

BACKGROUND OF THE INVENTION

Conventional low-noise amplifiers have input stages designed with small transistors to achieve a specified noise performance. The small transistors are easily damaged by electro-static discharge strikes. Conventional electro-static discharge protection circuits provide diode clamps between ground and the gates of the small transistors. However, the diode clamps to ground do not work well with the drain nodes of the small transistors.

It would be desirable to implement an electro-static discharge protection in integrated circuit based amplifiers.

SUMMARY OF THE INVENTION

The present invention concerns an apparatus having a plurality of power pads of an integrated circuit, a plurality of transistors, and one or more diodes. Each transistor may have a drain that forms a junction with a conductive layer of the integrated circuit. The diodes may be coupled between two of the power pads. A first portion less than all of an electro-static discharge that passes through a first of the two power pads and the conductive layer may be transferred through a first of the drains in a first of the transistors. A second portion less than all of the electro-static discharge may be transferred sequentially through (a) at least one of the diodes and (b) a second of the drains in a second of the transistors.

The objects, features and advantages of the present invention include providing a method and/or apparatus for implementing an electro-static discharge protection in integrated circuit based amplifiers that may (i) protect small transistors at drain nodes, (ii) route part of an electro-static discharge strike to large transistors, (iii) be easy to implement, (iv) handle strikes in either direction, (v) protect an input stage of a low-noise amplifier, (vi) maintain a noise performance of the amplifier, (vii) maintain a linearity of the amplifier, and/or (viii) be implemented in integrated circuits.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Embodiments of the present invention generally provide circuitry that provides electro-static discharge (e.g., ESD) strike (or pulse) protection at drain nodes of transistors in a multi-stage amplifier. One or more diodes are generally connected between an initial stage drain and/or bias pad and one or more later stage drains and/or bias pads. The diodes are generally unused (e.g., biased off) except during an electro-static discharge strike (or pulse). During a strike, the diodes may transfer a portion of the strike energy away from a corresponding drain node in the initial stage. The distribution of the strike energy among several stages generally provides a higher probability that the transistor in the initial stage survives the strike. Since the transistor dimensions (e.g., gate periphery) in the initial one or more stages are generally smaller than the transistor dimensions (e.g., gate periphery) in the later stages, the small transistors of the initial stages are more susceptible to damage by a strike than the large transistors in the subsequent stages. Reducing the amount of energy flowing through the small transistors generally improves electro-static discharge survivability.

Figure 1:
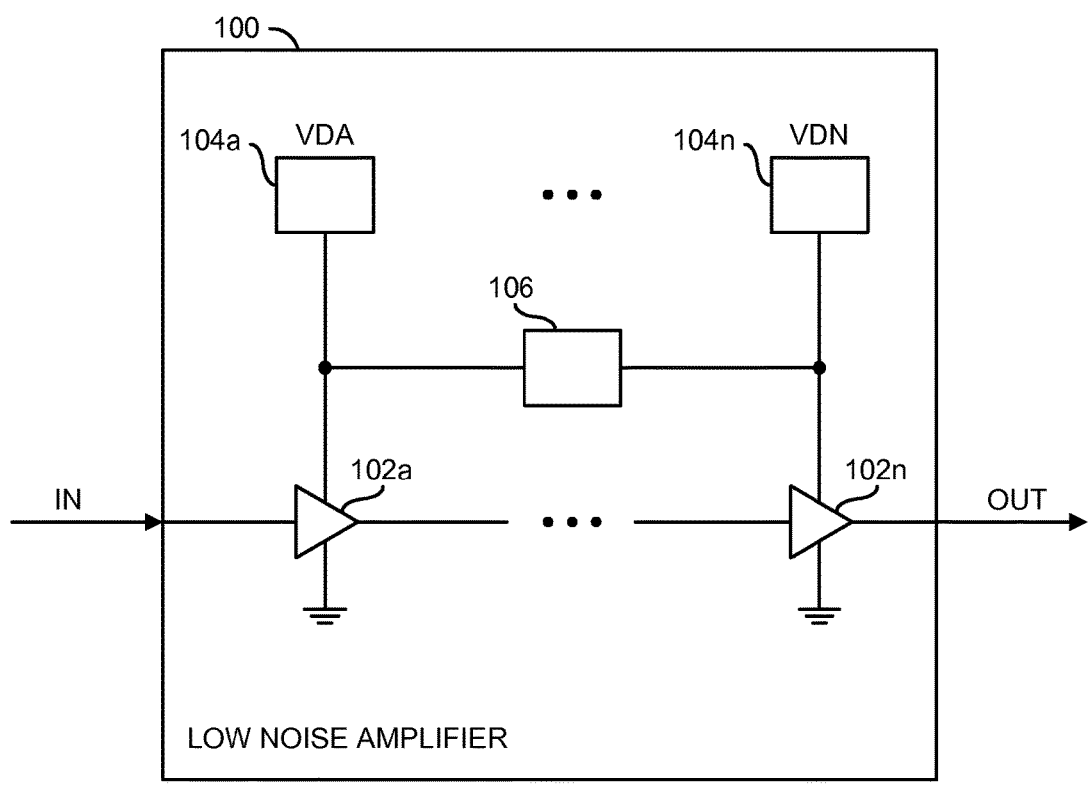
FIG. 1 is a block diagram of an apparatus in accordance with a preferred embodiment of the present invention.

Referring to FIG. 1, a block diagram of an apparatus 100 is shown in accordance with a preferred embodiment of the present invention. The apparatus (or circuit, or integrated circuit, or system) 100 generally implements a multi-stage amplifier circuit. The circuit 100 generally comprises multiple blocks (or circuits) 102a-102n, multiple blocks (or circuits) 104a-104n and at least one block (or circuit) 106. The circuits 102a to 106 may be implemented in hardware and/or simulated with software.

A signal (e.g., IN) may be received by the circuit 102a. The signal IN generally comprises an input signal to be amplified by the circuit 100. A signal (e.g., OUT) may be generated and presented by the circuit 102n. The signal OUT generally comprises an output signal that is an amplified version of the signal IN. A set of voltages (e.g., VDA-VDN) may be received by the circuits 104a-104n, respectively. Each voltage VDA-VDN may implement a power supply voltage for each circuit 102a-102n. In some embodiments, the voltages VDA-VDN may comprise drain bias voltages for the drains of the transistors within the circuit 102a-102n. Each of the circuits 102a-102n may also be connected to ground.

Each circuit 102a-102n may implement an amplifier circuit. The circuits (or stages) 102a-102n are generally operational to amplify the signal IN in successive stages to create the amplified signal OUT. In some embodiments, the circuit 100 may have as few as two circuits 102a-102n. In other embodiments, the circuit 100 may implement several (e.g., five) circuits 102a-102n.

The circuit 102a may implement an input stage amplifier circuit. The circuit 102a generally receives the signal IN and performs an initial amplification. To achieve a specified noise performance (e.g., 3 to 4 decibels), the circuit 102a may be implemented with small transistor features. For example, a transistor within the circuit 102a may have a small gate periphery (or dimension). In various embodiments, the transistor may have gate dimensions of two to four gate fingers, where each finger may be 0.10 micrometers (e.g., µm) to 0.50 µm long by 25 to 200 µm wide. Thus, the gate periphery of the transistor may range from approximately 0.1 millimeters (e.g., mm) to 1.6 mm. The source areas and the drain areas of the transistor are generally proportional to the gate periphery dimension. A small gate periphery may correspond to a small source area and a small drain area. A large gate periphery may correspond to a large source area and a large drain area. Other transistor dimensions may be implemented to meet the criteria of a particular application.

The circuit 102n may implement an output stage amplifier circuit. The circuit 102n may generate the signal OUT. The circuit 102n is generally implemented with larger features than the circuit 102a. For example, a transistor within the circuit 102n may have a gate periphery in the range of 5 mm to 30 mm. Other transistor dimensions may be implemented to meet the criteria of a particular application.

Each circuit 104a-104n may implement a power supply bonding pad circuit. The circuits 104a-104n are generally operational to receive DC power voltages used to bias the circuits 102a-102n. In some embodiments, the voltages VDA-VDN received by the circuits 104a-104n may be similar to each other. In other embodiments, the voltages VDA-VDN may vary relative to each other by less than a forward-biased diode drop voltage. For example, adjacent voltages generally have no more than about a volt (e.g., 0.8 to 1.2 volts) difference. In still other embodiments, the voltages VDA-VDN may differ from each other by more than a single forward-bias diode voltage drop.

The circuit 106 may implement a diode network circuit. The circuit 106 is generally operational to transfer energy of an electro-static discharge strike at one of the circuits 104a-104n to one or more other circuits 104a-104n. In some embodiments, the circuit 106 is designed to convey a portion (e.g., less than all) of an electro-static discharge current between the circuit 104a and the conductive layer to the circuit 104n. From the circuit 104n, the portion of the electro-static discharge strike may be dissipated to the substrate through the larger transistor(s) in the circuit 102n. Therefore, the circuit 102a may be exposed to another portion (e.g., less than all) of the electro-static discharge current. The circuit 106 may include one or more diodes to respond to an electro-static discharge strike in which current flows in a particular direction. In some embodiments, the circuit 106 may include two or more diodes connected to handle strike currents in both directions.

Figure 2:
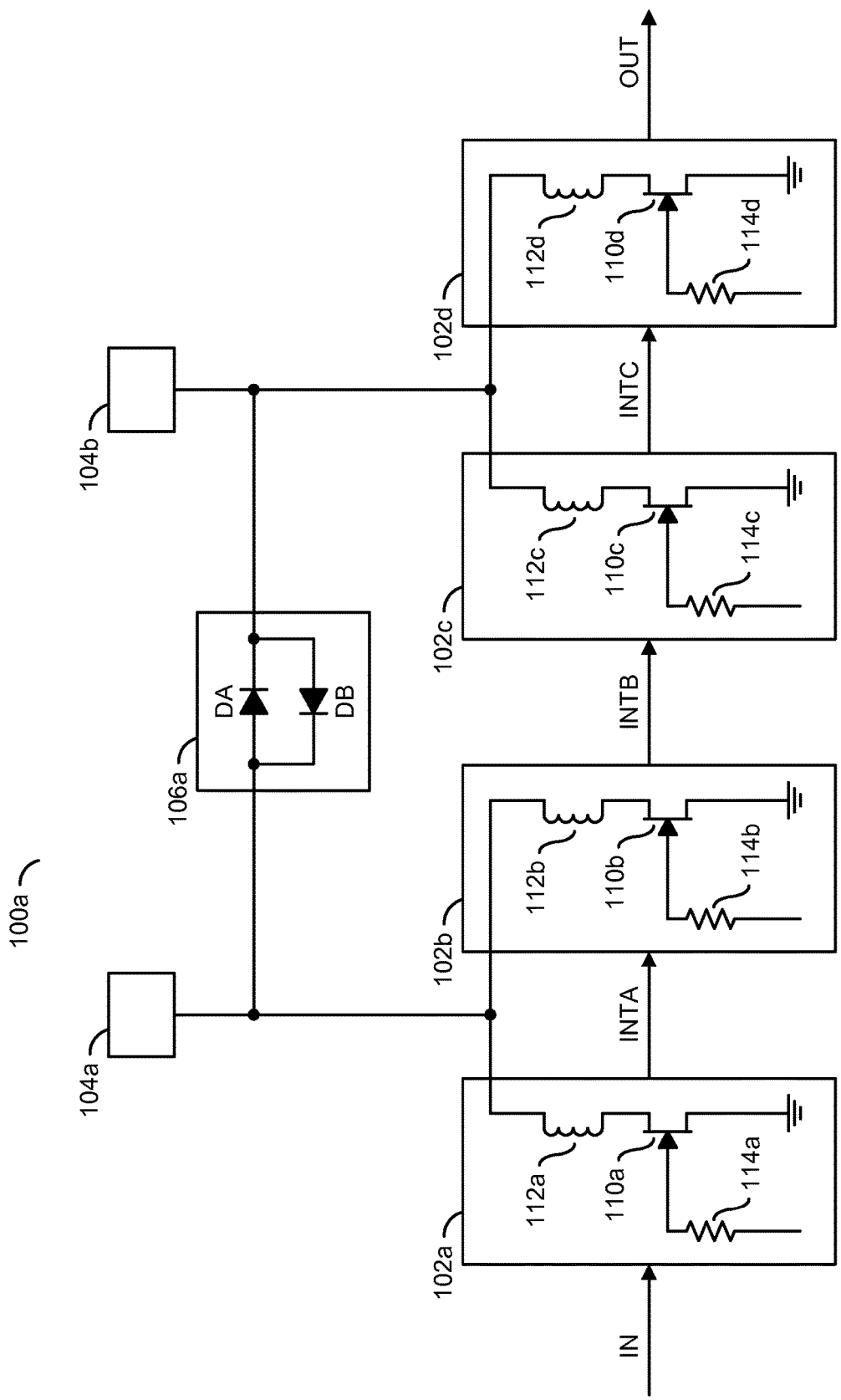
FIG. 2 is a block diagram of a circuit.

Referring to FIG. 2, a block diagram of an example implementation of a circuit 100a is shown. The circuit 100a may be a four-stage variation of the n-stage circuit 100. Each circuit 102a-102d generally comprises a respective block (or circuit) 110a-110d, a respective block (or circuit) 112a-112d, and a respective block (or circuit) 114a-114d. The circuit 106 generally comprises multiple blocks (or circuits) DA-DB.

DC connections are generally illustrated for a four-stage low-noise amplifier in the figure. A simple diode network circuit 106a is shown in the illustrated embodiment. In other embodiments, the circuit 106a may include a multiplicity of diodes, including back-to-back and series connected diodes. The circuit 106a may optionally include one or more resistors to help control a flow of the strike current.

The circuit 102a may receive the signal IN. A signal (e.g., INTA) may be generated by the circuit 102a and received by the circuit 102b. The signal INTA may implement an intermediate signal that is an amplified version of the signal IN. A signal (e.g., INTB) may be generated by the circuit 102b and received by the circuit 102c. The signal INTB may implement an intermediate signal that is an amplified version of the signal INTA. A signal (e.g., INTC) may be generated by the circuit 102c and received by the circuit 102d. The signal INTC may implement an intermediate signal that is an amplified version of the signal INTB. The circuit 102d may generate the signal OUT.

The circuit 112a may be connected between the circuit 104a and a node of the circuit 110a. The circuit 114a may be connected to another node of the circuit 110a. A node of the circuit 110a may be connected to a ground voltage. The circuits 110b-110d, 112b-112d, and 114b-114d may be connected in similar arrangements as the circuits 110a, 112a and 114a. Each circuit DA-DB may be connected between the circuits 104a and 104d.

Each circuit 110a-110d may implement a transistor. The transistors (or components) 110a-110d are generally operational to amplify input signals to generate larger voltage swings on output signals. A source node of each transistor 110a-110d may be connected to the ground voltage. A drain node of each transistor 110a-110d may be connected to a respective circuit 112a-112d. A gate node of each transistor 110a-110d may be connected to a respective circuit 114a-114d.

Each circuit 112a-112d may implement an inductor. The inductors (or components) 112a-112d are generally operational as load impedances for the transistors 110a-110d, respectively. Each inductor 112a-112d generally has an inductance value in a range of 20 picohenerys to 100 nanohenerys. Other inductance values may be implemented to meet the criteria of a particular application.

Each circuit 114a-114d may implement a resistor. The resistors (or components) 114a-114d are generally operational to provide biasing to the gates of the respective transistors 110a-110d. The resistors generally have a resistance value in the range of 1 to 100 ohms. Other resistance values may be implemented to meet the criteria of a particular application.

Each circuit DA-DB may be implemented as a diode. The diodes (or components) DA and DB are generally operational to switch on and conduct a portion of the electro-static discharge energy between the circuits 104a and 104b during an electro-static discharge strike. During normal operations, the diodes DA and DB are generally biased in a non-conducting (or off) condition. From the non-conducting condition (or state), the diodes DA and DB generally do not interfere with (or distort) the amplification of the signal IN. In some embodiments, each diode DA-DB may have a forward bias switch-on voltage of approximately one volt (e.g., 0.8 to 1.2 volts). Other switch-on voltages may be implemented to meet the criteria of a particular application.

During a positive electro-static discharge strike where the strike current enters the circuit 104a from outside the integrated circuit 100a, the diode DA may switch on and conduct a portion of the strike energy away from the circuit 102a (and 102b) and toward the circuits 102c and 102d. Therefore, only a fraction of the electro-static discharge energy is transferred through the inductor 112a and into the drain of the transistor 110a. The reduced amount of energy generally helps the transistor 110a survive the strike. A remainder of the strike energy is generally transferred to the drains of the transistors 110b-110d. Since the transistors 110b-110d, and in particular, the transistor 110d, are larger (e.g., larger gate periphery/drain dimensions) than the transistor 110a, the transistors 110b-110d are less susceptible to the electro-static discharge damage and thus more likely to survive the electro-static discharge event.

During an electro-static discharge strike where strike current leaves the circuit 104a (e.g., all polarities of the circuits are reversed) and out of the integrated circuit 100a, the diode DB generally switches on and connects the circuit 104a to the circuit 104b. Therefore, the strike energy is spread among the transistors 110a-110d in the same fashion as the entering strike energy. As a result, the small transistor 110a is less likely to be destroyed by the strike than if the entire strike energy passes through the drain of the transistor 110a. Likewise, the drains of the other transistors 110b-110d experience lower strike energies and thus are more likely to survive the event. Furthermore, additional diodes may be reverse connected between ground and the circuits 104a-104n to route negative electro-static discharge pulses to the ground.

Figure 3:
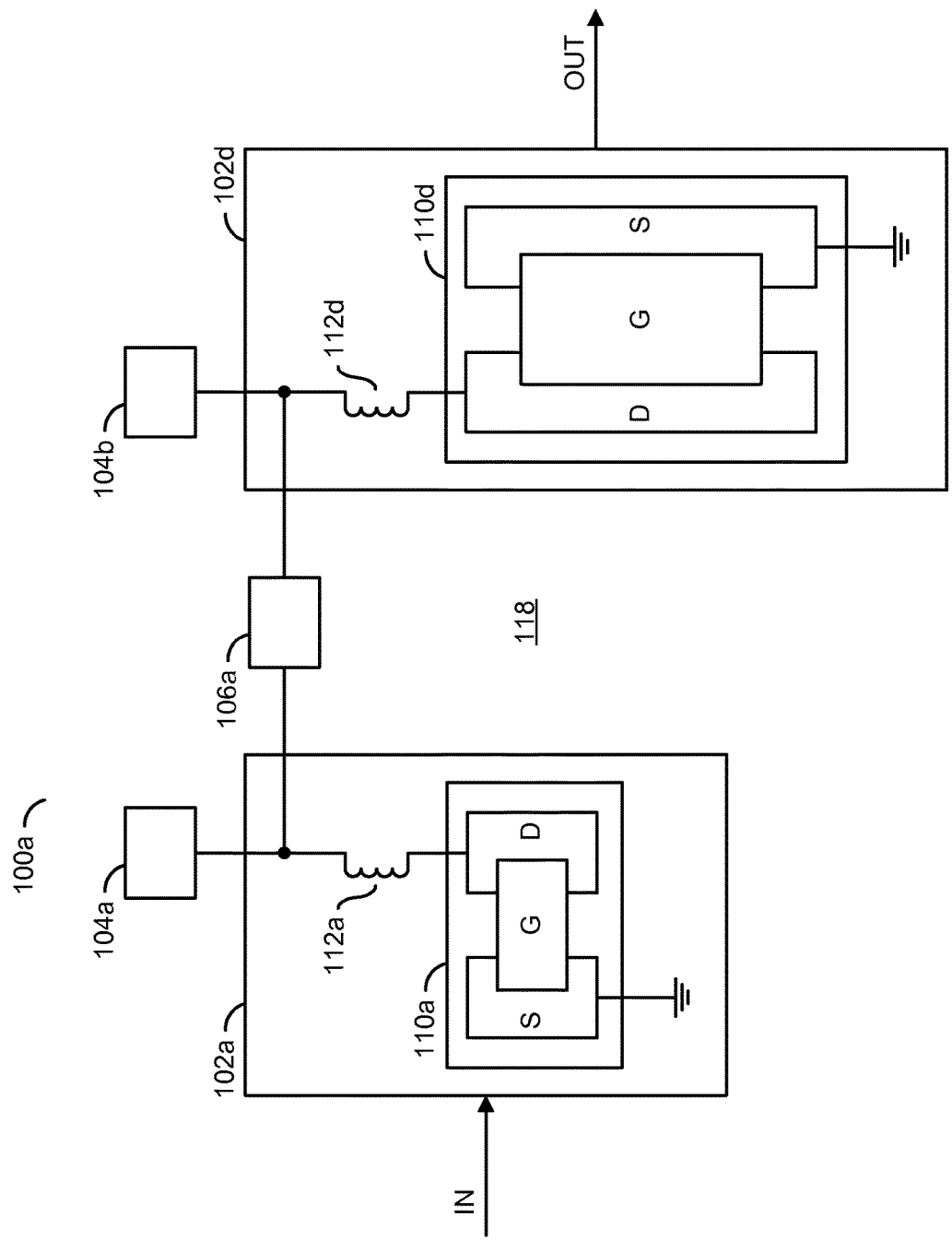
FIG. 3 is a partial block diagram of a layout of the circuit.

Referring to FIG. 3, a partial block diagram of an example layout of the circuit 100a is shown. In the example, the transistors are generally illustrated with single-finger gates. Other numbers of gate fingers may be implemented to meet the criteria of a particular application.

The circuit 110a generally comprises a source node (e.g., S), a gate node (e.g., G) and a drain node (e.g., D). The circuit 110d generally comprises a source node S, a gate node G and a drain node D. The drains D and sources S are generally formed on (or in) a conductive layer (or substrate) 118 and form electro-mechanical junctions with the conductive layer 118. The inductors 112a and 112d may be connected to the respective drain nodes D. In some embodiments, the conductive layer 118 may be an AlGaAs layer formed on a super lattice supported by a GaAs substrate. In other embodiments, the conductive layer 118 may be a semiconductor (e.g., Si) substrate. Other conductive layers and/or substrates may be implemented to meet the criteria of a particular application.

The gate periphery in the transistor 110a may have a defined dimension resulting in a defined drain area adjoining (in contact with) the conductive layer 118. The gate periphery in the transistor 110d may have another defined dimension resulting in another drain area adjoining (in contact with) the conductive layer 118. In various embodiments, the gate periphery in the transistor 110d is larger than the gate periphery in the transistor 110a. Therefore, the transistor 110d has a larger area and thus is more immune to an electro-static discharge strike on the drain node than the transistor 110a. In the example circuit 100a, the smaller input transistor 110a (and possibly 110b) is protected by the larger output transistor 110d (and possibly 110c) and so increases the overall electro-static discharge resilience of the circuit 100a.

Figure 4:
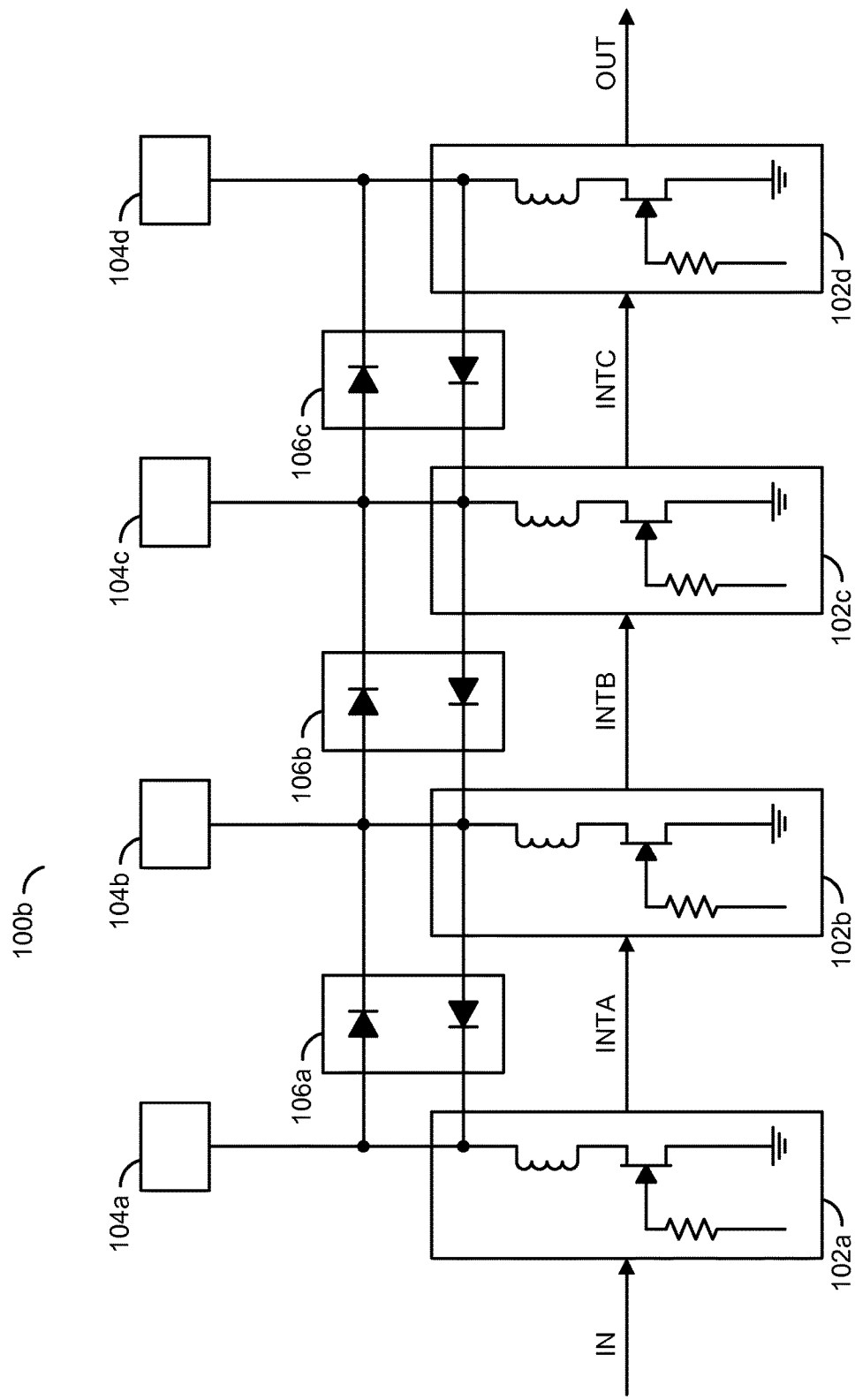
FIG. 4 is a block diagram of another circuit.

Referring to FIG. 4, a block diagram of a circuit 100b is shown. The circuit 100b may be a four-stage variation of the circuit 100 and/or the circuit 100a. The circuit 100b generally comprises the circuits 102a-102d, the circuits 104a-104d and multiple diode networks 106a-106c.

Each circuit 106b-106c may be an instantiation of the circuit 106a with different gate periphery dimensions. The opposite-polarity connections of the diodes generally allow for the transfer of energy in either direction. In the circuit 100b, all stages (or transistors 102a-102d) may be protected by the larger size (or larger area) of the entire amplifier, while retaining full independence of the biasing for each stage. Therefore, an electro-static discharge strike at the circuits 104a, 104b, 104c or 104d may utilize all of the transistors 102a-102d to conduct the spike energy to ground. Furthermore, the resulting series connections of the circuits 106a-106c may allow the bias voltage at the circuit 104d to be several (e.g., three) diode switch-on voltages higher (or lower) than the bias voltage received at the circuit 104a, and still maintain all of the diodes in the non-conductive state. The configuration illustrated generally allows better control of the noise and linearity of the amplifier at all conditions of turndown, where the gate biases are adjusted to control the gains of the respective stages.

During an electro-static discharge strike where the strike current enters the circuit 104b, some diodes in the circuits 106b and 106c may switch on and conduct a portion (e.g., less than all) of the strike energy away from the circuits 102b/104b and to the circuits 102c/104c and 102d/104d. One or more diodes in the circuit 106a may switch on and conduct a portion (e.g., less than all) of the strike energy to the circuits 102a/104a. Therefore, only a fraction of the electro-static discharge current is transferred through the inductor and into the drain of the transistor in the circuit 102b. The reduced current generally helps the transistor in the circuit 102b survive the strike. A remainder of the strike energy may be transferred to the drains of the transistors in the circuits 102a, 102c and 102d. Since the transistors in the circuits 102c and 102d, and in particular, the transistor in the circuit 102d, are larger (e.g., larger gate periphery/drain dimensions) than the transistor in the circuit 102b, the transistors in the circuits 102c and 102d are less susceptible to the strike energy and thus more likely to survive the electro-static discharge event.

Figure 5:
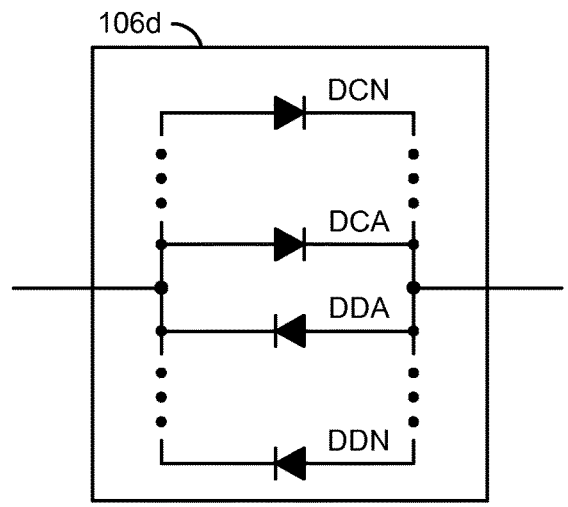
FIG. 5 is a schematic diagram of a diode network.

Referring to FIG. 5, a schematic diagram of an example implementation of a circuit 106d is shown. The circuit 106d may be a variation on the circuits 106 and/or 106a-106c. The circuit 106d generally comprises multiple diodes (e.g., DCA-DCN) and multiple diodes (e.g., DDA-DDN). Each diode DCA-DCN may be wired in parallel with each other. Each diode DDA-DDN may be wired in parallel with each other. The cathodes and anodes of the diodes DDA-DDN may be reversed from the cathodes and anodes of the diodes DCA-DCN. The implementation of parallel diodes generally allows the circuit 106d to carry larger currents during an electro-static discharge event than the circuit 106a.

Figure 6:
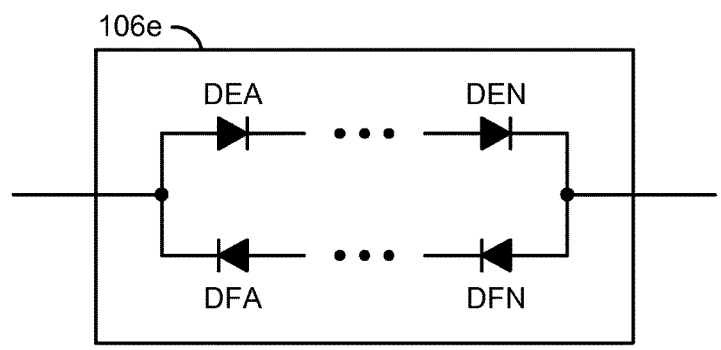
FIG. 6 is a schematic diagram of another diode network.

Referring to FIG. 6, a schematic diagram of an example implementation of a circuit 106e is shown. The circuit 106e may be a variation on the circuits 106 and/or 106a-106d. The circuit 106e generally comprises multiple diodes (e.g., DEA-DEN) and multiple diodes (e.g., DFA-DFN). The diodes DEA-DEN may be connected in series to present a switch-on voltage N time larger than a single diode switch-on voltage. The diodes DFA-DFN may be connected in series to present a switch-on voltage N time larger than a single diode switch-on voltage. Therefore, a bias voltage difference between the circuits 104a-104n interconnected by the circuit 106e may be several switch-on voltages apart from each other and still keep the diodes within the circuit 106e switched off under normal operating conditions.

Figure 7:
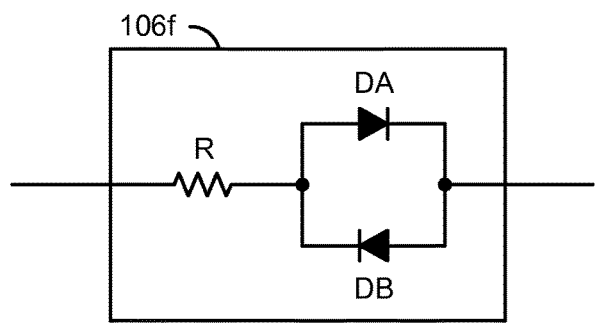
FIG. 7 is a schematic diagram of yet another diode network.

Referring to FIG. 7, a schematic diagram of an example implementation of a circuit 106f is shown. The circuit 106f may be a variation on the circuits 106 and/or 106a-106e. The circuit 106f generally comprises the diodes DA-DB and a resistor (e.g., R). The resistor R may be wired in series with diode the pair DA-DB. The resistor R generally restricts an amount of energy an electro-static discharge pulse may transfer through the circuit 106f. A higher resistance generally results in a smaller portion of the pulse current being transferred.

The small periphery transistors used in the front-end stages of the circuits 100-100b generally make the circuits 100-100b susceptible to electro-static discharge damage. Larger transistors used in later stages may have greater immunity to the electro-static discharge events and so may be used to help conduct the spike energy. The drains in the individual stages of an amplifier may be biased separately to allow the drain currents to be regulated to achieve noise and linearity specifications. The external drain voltages are generally similar, typically 3-5 volts in low noise pseudomorphic high electron mobility transistor (e.g., pHEMT) processes.

The functions and structures illustrated in the diagrams of FIGS. 1-7 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example a non-transitory storage media, and may be executed by one or more of the processors. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a plurality of power pads of an integrated circuit;
a plurality of transistors each having a drain that forms a junction with a conductive layer of said integrated circuit; and
one or more diodes coupled between two of said power pads, wherein (i) a first portion less than all of an electro-static discharge that passes through a first of said two power pads and said conductive layer is transferred through a first of said drains in a first of said transistors, and (ii) a second portion less than all of said electro-static discharge is transferred sequentially through (a) at least one of said diodes and (b) a second of said drains in a second of said transistors.

2. The apparatus according to claim 1, wherein said second drain has a larger area in contact with said conductive layer than said first drain.

3. The apparatus according to claim 1, wherein said first transistor and said second transistor form part of a low-noise amplifier.

4. The apparatus according to claim 1, further comprising a third transistor configured to transfer a third portion less than all of said electro-static discharge sequentially through (i) one or more additional diodes and (ii) a third drain of said third transistor.

5. The apparatus according to claim 1, further comprising a third transistor configured to transfer a third portion less than all of said electro-static discharge through a third drain of said third transistor coupled to said first power pad through a component.

6. The apparatus according to claim 1, wherein (i) said integrated circuit is configured to receive an input signal and (ii) said first transistor is configured to amplify said input signal.

7. The apparatus according to claim 1, wherein (i) said second transistor is configured to amplify an intermediate signal using said second transistor to generate an output signal and (ii) said output signal is transferred out of said integrated circuit.

8. The apparatus according to claim 1, wherein said electro-static discharge flows into said first power pad.

9. The apparatus according to claim 1, wherein said electro-static discharge flows out of said first power pad.

10. A method for electro-static discharge protection, comprising the steps of:
(A) receiving an electro-static discharge that passes through a first of a plurality of power pads and a conductive layer of an integrated circuit;
(B) transferring a first portion less than all of said electro-static discharge through a first drain of a first transistor that forms a first junction with said conductive layer; and
(C) transferring a second portion less than all of said electro-static discharge sequentially through (i) one or more diodes coupled to said first power pad and (ii) a second drain of a second transistor that forms a second junction with said conductive layer.

11. The method according to claim 10, wherein said second drain has a larger area in contact with said conductive layer than said first drain.

12. The method according to claim 10, wherein said first transistor and said second transistor form part of a low-noise amplifier.

13. The method according to claim 10, further comprising the step of:
transferring a third portion less than all of said electro-static discharge sequentially through (i) one or more additional diodes and (ii) a third drain of a third transistor.

14. The method according to claim 10, further comprising the step of:
transferring a third portion less than all of said electro-static discharge through a third drain of a third transistor coupled to said first power pad through a component.

15. The method according to claim 10, further comprising the steps of:
receiving an input signal at said integrated circuit; and
amplifying said input signal using said first transistor.

16. The method according to claim 10, further comprising the steps of:
amplifying an intermediate signal using said second transistor to generate an output signal; and
transferring said output signal out of said integrated circuit.

17. An apparatus comprising:
means for receiving an electro-static discharge that passes through said means for receiving and a conductive layer of an integrated circuit;
means for transferring a first portion less than all of said electro-static discharge through a first drain of a first transistor that forms a first junction with said conductive layer; and
means for transferring as second portion less than all of said electro-static discharge sequentially through (i) one or more diodes coupled to said means for receiving and (ii) a second drain of a second transistor that forms a second junction with said conductive layer.

* * * * *